United States Patent

Economikos et al.

[11] Patent Number: 5,742,021
[45] Date of Patent: Apr. 21, 1998

[54] HIGH THERMAL CONDUCTIVITY SUBSTRATE AND THE METHOD OF BRAZING A CAP THERETO

[75] Inventors: Laertis Economikos; Robert Hannon, both of Wappingers Falls; Richard P. Surprenant, Poughkeepsie; Thomas VanDuynhoven, Monroe, all of N.Y.

[73] Assignee: International Business Machines Corporation, Armonk, N.Y.

[21] Appl. No.: 695,433

[22] Filed: Aug. 12, 1996

[51] Int. Cl.[6] ................................... B23K 9/10
[52] U.S. Cl. ................................... 219/85.22
[58] Field of Search ................ 219/78.01, 85.1, 219/85.22, 200, 209

[56] References Cited

U.S. PATENT DOCUMENTS

| | | | |
|---|---|---|---|
| 3,699,305 | 10/1972 | Reenstra et al. | 219/200 |
| 4,374,316 | 2/1983 | Inamori et al. | 219/209 |
| 4,481,403 | 11/1984 | Del Monte | 219/209 |
| 4,493,964 | 1/1985 | Shigemasa | 219/78.02 |
| 4,611,745 | 9/1986 | Nakahashi et al. | 228/123 |
| 4,769,525 | 9/1988 | Leatham | 219/209 |
| 5,010,233 | 4/1991 | Henschen et al. | 219/209 |
| 5,041,695 | 8/1991 | Olenick et al. | 174/52.4 |
| 5,175,409 | 12/1992 | Kent | 219/85.22 |
| 5,197,892 | 3/1993 | Yoshizawa et al. | 439/91 |
| 5,381,944 | 1/1995 | Makowiecki et al. | 228/124.5 |
| 5,504,296 | 4/1996 | Sato et al. | 219/85.1 |

FOREIGN PATENT DOCUMENTS 03-283549 12/1991 Japan.

OTHER PUBLICATIONS

"Module Removal By Inlaid Heater Modules", IBM Technical Disclosure Bulletin V12 N8, Jan. 1970, pp. 1193–1194.

*Primary Examiner*—Adolf Berhane
*Attorney, Agent, or Firm*—Whitham, Curtis, Whitham & McGinn; Steven J. Soucar

[57] ABSTRACT

Temperature gradients between a ceramic substrate of high thermal conductivity and the braze materials used to attach a metallic device such as a cap are reduced by using an embedded internal heat source in the substrate to minimize the thermal gradient, thereby minimizing the stresses that can result in substrate cracking when a cap is brazed onto the substrate.

5 Claims, 1 Drawing Sheet

HIGH THERMAL CONDUCTIVITY SUBSTRATE AND THE METHOD OF BRAZING A CAP THERETO

BACKGROUND OF THE INVENTION

1. Field of the Invention

The present invention generally relates to brazing metallic devices, such as protective metal caps, to ceramic substrates having high thermal conductivity and, more particularly, to a method for improving the ability to braze to such substrates without high temperature gradients that can cause cracking of the substrates.

2. Background Description

Brazing a metallic cap on a high thermal conductivity ceramic substrate, such as aluminum nitride (AlN), requires applying high temperatures locally to compensate for the heat losses to the substrate. This is accomplished using a seam seal tool. High temperature gradients are developed between the braze material and the substrate which, in turn, develops high stresses that can cause cracking in the ceramic substrate.

In order to avoid this problem, it is known to employ a thermal interposer in the form of a lower thermal conductivity barrier which is attached to the substrate prior to brazing the cap on the substrate. This solution, however, is a multi-step operation which adds to the cost of production.

SUMMARY OF THE INVENTION

It is therefore an object of the present invention to provide a way to reduce the temperature gradients between the ceramic substrate and the braze materials when brazing a metallic device, such as a cap, to the substrate.

According to the invention, an internal heat source, in the form of an electrical resistance heater wire, is embedded in the substrate adjacent to the location where the metallic device is to be brazed to the substrate. Passing an electrical current through the electrical resistance heater wire generates heat in the body of the substrate, thereby minimizing the thermal gradient from the surface source of heat. This minimizes the stresses which can lead to cracking in the substrate when a cap is brazed onto the substrate. In addition, an electrical current can later be passed through this electrical resistance heater wire at a later point in time to again melt the braze material so that the metallic device can be removed if required.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
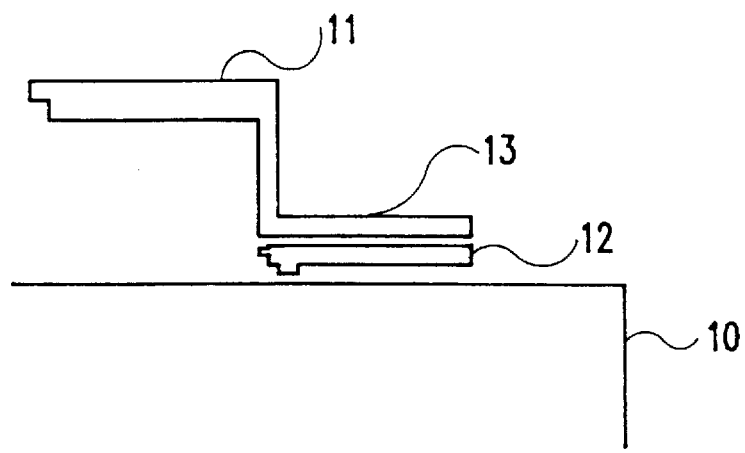
FIG. 1 is a cross-sectional view of a substrate with a cap and braze material illustrating a prior art method of directly brazing the cap to the substrate.

Referring now to the drawings, and more particularly to FIG. 1, there is shown a ceramic substrate 10, such as AlN, which has high thermal conductivity. This substrate may have mounted thereon electronic circuits or devices (not shown) which are to be protected by a metallic cap 11. To simplify the manufacturing process, it is desirable to braze the cap 11 directly to the substrate 10. Conventionally, this is done by inserting the braze material 12 between the flange 13 of the cap and the substrate 10 and then, with a roller of a seam seal tool, applying heat and pressure the flange 13 to melt the braze material 12. However, in order to do this, very high temperatures are required to melt the braze material 12 since AlN acts as a heat sink. These high temperatures, coupled with the pressure of the seam seal tool roller, produce temperature gradients between the braze material 12 and the substrate 10 which, in turn, develops high stresses that can cause cracking in the ceramic substrate 10.

Figure 2:
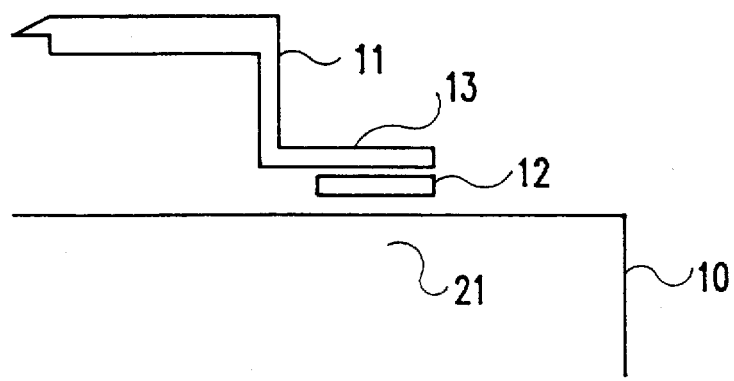
FIG. 2 is a cross-sectional view of a substrate with a cap and braze material illustrating the method according to the present invention of directly brazing the cap to the substrate.
Figure 3:
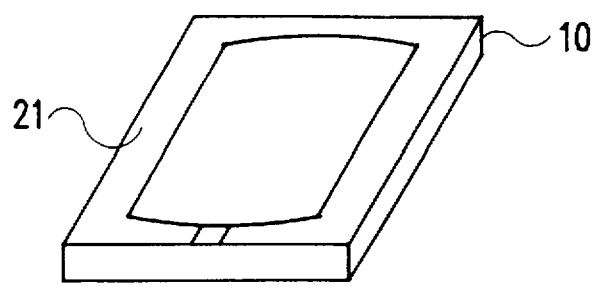
FIG. 3 is a pictorial representation of the substrate used in the practice of the invention showing the embedded resistance heating wire.

The present invention is illustrated in FIGS. 2 and 3. In FIG. 2, the same reference numerals as used in FIG. 1 represent the same elements. What has been added to the structure of FIG. 1 is the addition of an electrical resistance heater wire 21 embedded in the ceramic substrate 10 adjacent the braze material 12. FIG. 3 shows the embedded wire 21 in the substrate 10. The geometric shape of the wire 21 conforms with that of the flange of the cap 11 and may be rectangular, as shown, circular or other convenient geometric shape.

Preferably, the braze material 12 is melted without the need for rollers by applying an electrical current to the electrical resistance heater wire 21. Since the embedded wire is immediately below the braze material 12, there is relatively less loss of heat to the surrounding substrate 10, with a greater proportion of the heat from the wire 21 being used to melt the braze material 12. Thus, it is possible to provide all of the thermal input required for braze operations by applying an electric current to the resistance heater wire 21 to heat the substrate internally. Alternatively, the heat supplied by the resistance heater wire 21 may assist in braze operations, with additional heat being supplied externally as required. Moreover, the embedded wire 21 provides a convenient way to remove the cap 11 if necessary for repair of the electronic circuit or devices that may be mounted on the substrate 10.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method for improving ability to braze on high thermal conductivity substrates comprising the steps of:

embedding a resistance heater wire in a substrate, the resistance heater wire having a geometric configuration conforming with a metallic device to be brazed to the substrate;

inserting a braze material between the embedded resistance heater wire and the metallic device to be brazed to the substrate; and applying an electric current to the resistance heater wire to heat the substrate internally during braze operations.

2. The method recited in claim 1 wherein the step of applying an electric current to the resistance heater wire provides all thermal input required for braze operations to melt the braze material to braze the metallic device to the substrate.

3. The method recited in claim 1 wherein the step of applying an electric current to the resistance heater wire assists in braze operations, further comprising the step of concurrently applying external heat during braze operations.

4. The method recited in claim 1 further comprising the step of applying an electric current to the resistance heater wire to melt the braze material in order to remove the metallic device after first brazing the metallic device to the substrate.

5. A substrate of high thermal conductivity on which a metallic device is to be brazed, the improvement consisting of a resistance heater wire embedded in said substrate and having a geometric configuration conforming with the metallic device such that when a braze material is inserted between the embedded resistance heater wire and the metallic device to be brazed to the substrate and an electric current is applied to the resistance heater wire, the substrate is heated internally to transfer heat to the braze material during braze operations.

* * * * *